(12) United States Patent
Masumoto et al.

(10) Patent No.: US 8,381,967 B1
(45) Date of Patent: Feb. 26, 2013

(54) BONDING A SOLDER BUMP TO A LEAD USING COMPRESSION AND RETRACTION FORCES

(75) Inventors: Mutsumi Masumoto, Beppu (JP); Jesus Bajo Bautista, Jr., Baguio (PH); Raymond Maldan Partosa, Baguio (PH); James Raymond Baello, Baguio (PH)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/343,941

(22) Filed: Jan. 5, 2012

(51) Int. Cl.
*B23K 31/02* (2006.01)

(52) U.S. Cl. .................. 228/234.1; 228/180.22

(58) Field of Classification Search .. 228/179.1–180.22, 228/234.1
See application file for complete search history.

(56) References Cited

U.S. PATENT DOCUMENTS

| | | | | |
|---|---|---|---|---|
| 4,605,833 | A | * | 8/1986 | Lindberg .................... 219/56.22 |
| 6,105,848 | A | * | 8/2000 | Horibe et al. .............. 228/110.1 |
| 6,119,924 | A | * | 9/2000 | Toi et al. .................... 228/179.1 |
| 6,131,795 | A | * | 10/2000 | Sato .............................. 228/102 |
| 7,060,528 | B2 | * | 6/2006 | Nishikawa et al. ........... 438/110 |
| 7,075,036 | B2 | * | 7/2006 | Ogimoto et al. .............. 219/243 |
| 7,683,482 | B2 | * | 3/2010 | Nishida et al. ................ 257/737 |
| 7,757,930 | B2 | * | 7/2010 | Maki et al. ............... 228/180.21 |
| 7,861,913 | B2 | * | 1/2011 | Miyazaki ...................... 228/228 |
| 8,177,862 | B2 | * | 5/2012 | Hwang et al. ................ 29/25.01 |
| 8,211,745 | B2 | * | 7/2012 | Eom et al. ..................... 438/108 |
| 2006/0097029 | A1 | * | 5/2006 | Kainuma et al. ........... 228/110.1 |

* cited by examiner

*Primary Examiner* — Kiley Stoner
*Assistant Examiner* — Carlos Gamino
(74) *Attorney, Agent, or Firm* — Steven A. Shaw; W. James Brady; Frederick J. Telecky, Jr.

(57) ABSTRACT

Methods of connecting solder bumps located on dies to leads located on substrates are disclosed herein. One embodiment includes applying a first compression force between the solder bump and the lead; relieving the first compression force between the solder bump and the lead; and applying a second compression force between the solder bump and the lead.

19 Claims, 4 Drawing Sheets

BONDING A SOLDER BUMP TO A LEAD USING COMPRESSION AND RETRACTION FORCES

BACKGROUND

The assembly of flip chip devices requires electrical connection or bonding of solder bumps on a die to leads on a substrate or printed circuit board. One method of achieving the electrical connections is via a thermal compression technique whereby the substrate and die are compressed together under a heated condition. Solder bumps on the die are aligned with leads on the substrate and then forced together via a compressive force. Ideally, the resulting connection is a wet connection that is free of traps. In the formation of a wet connection molten solder on the solder bump flows to or into the lead. A "wet connection" as used herein refers to a connection in which a good alloy bond is formed between the solder bump and lead.

Traps may form proximate the bond or between the bumps and the leads and may hold materials, such as non-conductive pastes used in the fabrication of the devices. These traps may reduce the bond area and weaken the connection between the die and the substrate. They may also hold impurities that are not meant to be in the finished flip chip device.

Further complications arise in flip chip fabrication when the electrical connection between the solder bumps and the leads are not wet. Non-wet bonds or connections do not conduct electricity well and may not conduct electricity at all. Additionally, a non-wet bond is more likely to suffer premature failure.

DETAILED DESCRIPTION

Circuits and methods of fabricating circuits are described herein. More specifically, methods of bonding a solder bump on a die to a lead on a substrate are disclosed herein. The circuits described herein are flip chip circuits; however, the bonding methods described herein may be applicable to other types of circuits.

Figure 1:
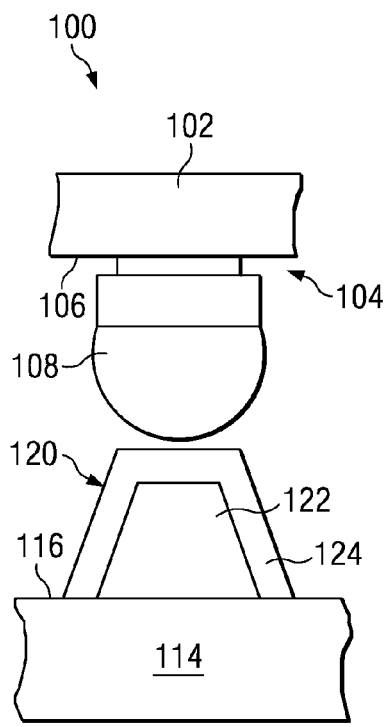
FIG. 1 is a schematic diagram of an embodiment of a flip chip device having a solder bump on a die that is aligned with a lead on a substrate.
Figure 2:
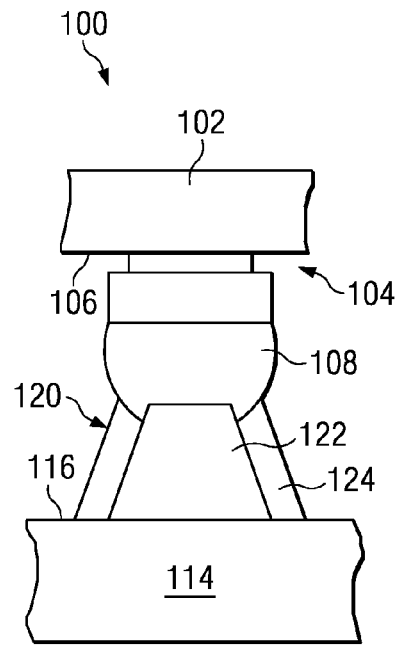
FIG. 2 is a schematic diagram of the solder bump and lead of FIG. 1 subsequent to thermal compression bonding and forming an ideal wet connection without any traps.

Reference is made to FIGS. 1 and 2 which are elevation views of a flip chip device 100, sometimes referred to herein simply as "the device 100", in different stages of fabrication. The device 100 has a die 102 that may have a plurality of electronic components and electrical connections (not shown) located thereon. An under metal bump 104, sometimes referred to as an UMB, is fabricated onto a first side 106 of the die 102. The under metal bump 104 is a conductor that electrically connects to components on the die 102. The under metal bump 104 also serves as a mounting area for a solder bump 108. The solder bump 108 serves to electrically and/or mechanically connect or bond the die 102 to a substrate 114 as described in greater detail below.

The substrate 114 has a surface 116 on which a lead 120 is located. The lead 120 has a conductor 122 that may be electrically connected to other components or conductors (not shown) located on or attached to the substrate 114. During fabrication of the substrate 114 or thereafter, a coating 124 may be placed over the conductor 122. In some embodiments, the coating 124 is a conventional non-conducting paste. As described in greater detail below, a good electrical connection between the solder bump 108 and the conductor 122 requires that the coating 124 be removed from the proximity of the electrical connection. It is noted that both the substrate 114 and the die 102 may have more complex layers and materials than those described above and that the fabrication processes described herein are applicable to those more complex substrates and die. The object of the portion of the fabrication process described herein is to electrically and mechanically attach the die 102 to the substrate 114 by electrically and mechanically connecting the solder bump 108 and the lead 120 together.

Having described the die 102 and the substrate 114, the process of connecting them together will now be summarily described followed by a more detailed description of the process. Referring to FIG. 1, the process commences with aligning the solder bump 108 with the lead 120. Heat is applied to the proximity of the solder bump 108 and/or the lead 120. The die 102 and the substrate 114 are then compressed together in order to form a wet electrical connection between the solder bump 108 and the conductor 122 as shown in FIG. 2. As the solder bump 108 is pressed to the lead 120, it compresses and fractures or otherwise disrupts the coating 124. The disruption in the coating enables the solder bump 108 to bond to the conductor 122. It is noted that the connection between the solder bump 108 and the conductor 122 of FIG. 2 is a wet connection that ensures conductivity. One of the purposes of the methods and circuits described herein is to achieve the ideal connection shown in FIG. 2. As described in greater detail below, compression and retraction forces are applied between the die 102 and the substrate 114 in order to achieve the bond show in FIG. 2.

Figure 3:
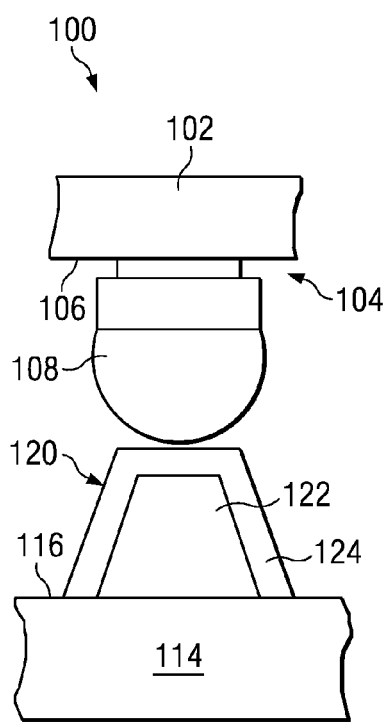
FIG. 3 is a schematic diagram of a solder bump in a non-wet connection with a lead.
Figure 4:
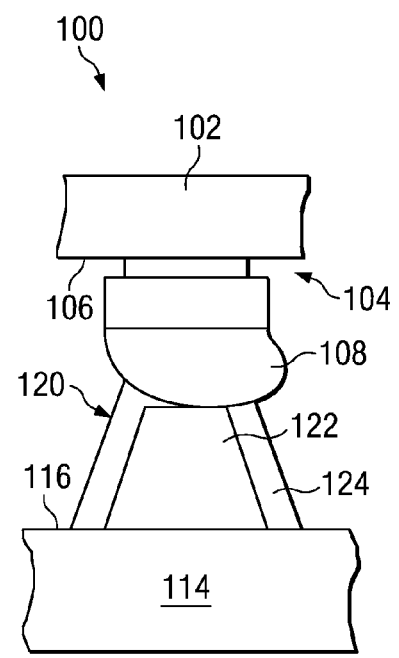
FIG. 4 is a schematic diagram of a solder bump in another non-wet connection with a lead.
Figure 5:
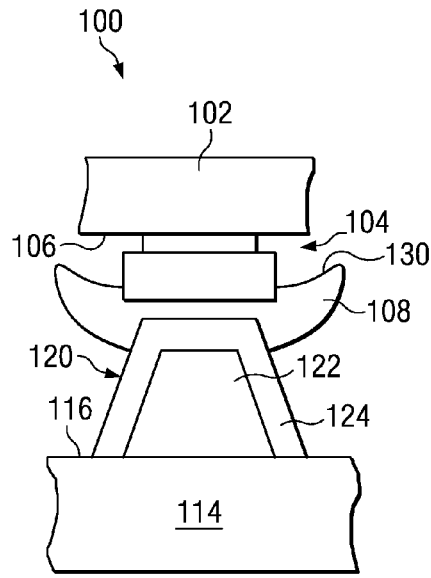
FIG. 5 is a schematic diagram of a solder bump that has formed a trap when compressed onto a lead.

In many situations using conventional fabrication methods, the ideal connection of FIG. 2 is not achieved, which can result in a non-functioning circuit or a circuit that will eventually fail. Examples of a few different failed connections between the solder bump 108 and the lead 120 are shown in FIGS. 3-5. In FIG. 3, the solder bump 108 has not made electrical contact with the lead 120. This is sometimes referred to as a non-wet connection. In FIG. 4, the solder bump 108 has made contact with the lead 120, but some of the coating 124 is located between the conductor 122 and the solder bump 108. This connection is also non-wet and may or may not conduct electricity. In either event, the connection is poor and is likely to fail. In some situations, the coating 124 is non-conductive, therefore, it is possible that the connection between the solder bump 108 and the conductor 122 has a gap or trap that is filled with the non-conductive material, which negatively affects the operation of the device 100.

FIG. 5 shows a situation in which the solder bump 108 has squeezed out. In the situation of FIG. 5, the solder bump 108 has not made adequate electrical contact with the conductor 122. A large portion of the material of the solder bump 108 has been effectively removed from the proximity of the bond, which makes any possible electrical connection very weak. In addition, a trap 130 has been created. The trap 130 may trap chemicals and materials used in the fabrication of the device 100, which may cause future problems with the device 100. For example, the trapped chemicals or materials may prevent adhesion of other chemicals using in subsequent fabrication processes of the device 100. Or, the trapped chemicals or materials may cause corrosion, which in turn may cause an early failure of the device 100.

Figure 7:
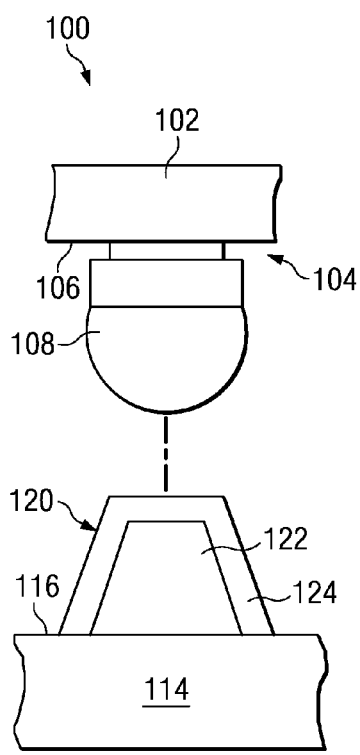
FIG. 7 is a schematic diagram showing alignment of the solder bump and lead during fabrication.
Figure 6:
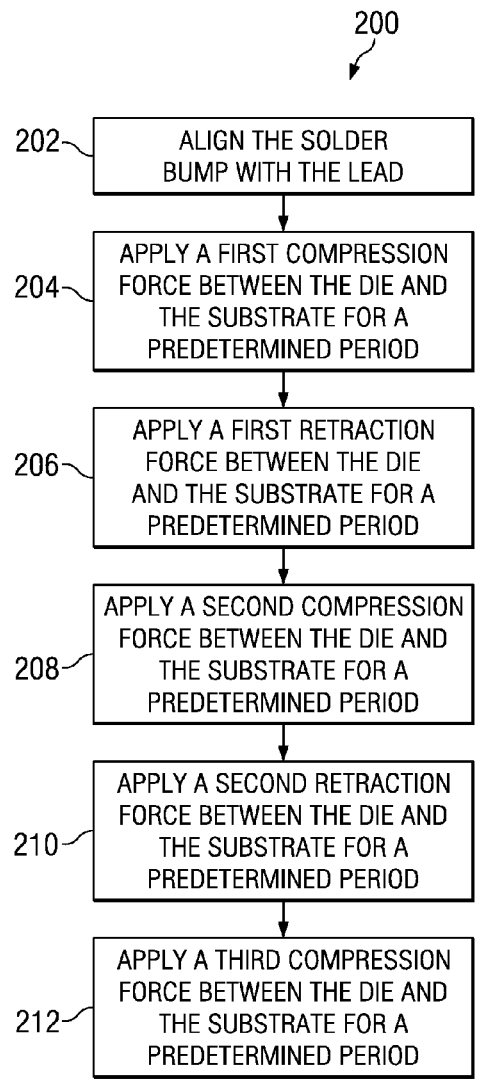
FIG. 6 is a flow chart illustrating an embodiment for fabricating the circuit of FIG. 2.

Methods of fabricating the device 100 that overcome the problems shown in FIGS. 3-5 are disclosed herein and are further described in the flow chart 200 of FIG. 6. The fabrication process commences with aligning the solder bump 108 with the lead 120 as shown in FIG. 7 and as described at step 202 of the flow chart 200. In some embodiments, the die 102 has a plurality of solder bumps that are not shown in the figures. Likewise, the substrate 114 may have a plurality of corresponding leads 120 that are also not shown in the drawings. In such configurations, the alignment process 202 may involve aligning the die 102 with the substrate 114 so that all the solder bumps are properly aligned with their corresponding leads.

Figure 8:
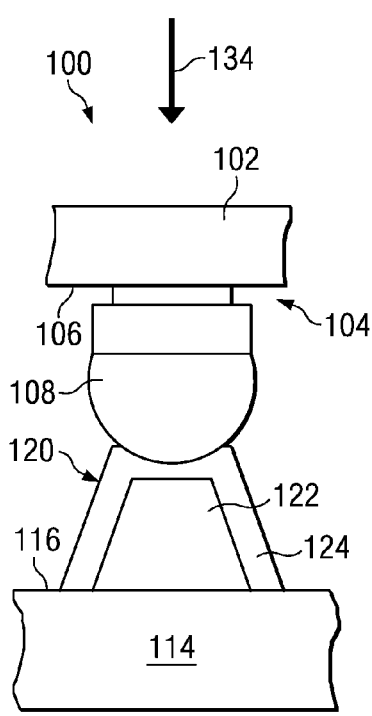
FIG. 8 is a schematic diagram showing the die and substrate of FIG. 7 being compressed by a first compression force for a predetermined period.

When the solder bump 108 and the lead 120 are aligned, a first compression force in a direction 134 is applied between the die 102 and the substrate 114 as shown in FIG. 8. This step is described in step 204 of the flow chart 200 of FIG. 2. The compression force is described as being applied between the die 102 and the substrate 114. However, the compression force acts on all structure between the die 102 and the substrate 114, including the solder bump 108 and the lead 120. Several forces will be applied between the die 102 and the substrate 104 in the fabrication procedure. In some embodiments, the forces move the die 104 relative to a fixed substrate 114. In other embodiments, the forces move the substrate 114 relative to a fixed die 102. The forces are applied with a predetermined force or magnitude for a predetermined period.

The first compression force causes the solder bump 108 to enter or penetrate into the coating 124 as show in FIG. 8. The first compression force is applied at a predetermined force or magnitude for a predetermined period. The magnitude and period of the first compression force are large enough to cause the solder bump 108 to penetrate the coating 124, but they may not be large enough to cause wetting between the solder bump 108 and the conductor 122. The magnitude of the first compression force is also not great enough to squeeze out the solder bump 108 as shown in FIG. 5.

Figure 9:
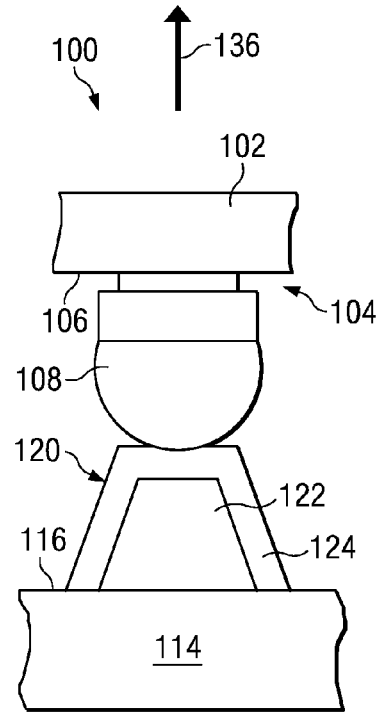
FIG. 9 is a schematic diagram showing the die and substrate of FIG. 7 after a first retracting force is applied.

At this point in the fabrication process, a compression force has been applied between the die 104 and the substrate to cause the solder bump 108 to enter the coating 124. The fabrication process continues as shown in FIG. 9 and described in step 206 of the flow chart 200 with the application of a first retraction force applied between the substrate 114 and the die 102. The first retraction force is applied in the direction 136, which is in the opposite direction of the compression force 134. Like the first compression force, the first retraction force is applied with a predetermined magnitude for a predetermined period. The application of the first retraction force causes the solder bump 108 to recede slightly from the coating 124. In some embodiments, the solder bump 108 may recede completely from the coating 124.

The fabrication process to this point has caused the solder bump 108 to penetrate into the coating 124 with a predetermined force and for a predetermined period. The solder bump 108 has now been retracted slightly from the coating 124. By applying the first compression force and then withdrawing the solder bump 108, the coating 124 proximate the anticipated bond between the solder bump 108 and the conductor 122 has been broken or otherwise disrupted. However, the first compression force did not have a magnitude great enough to squeeze out the solder bump 108 as shown in FIG. 5.

Figure 10:
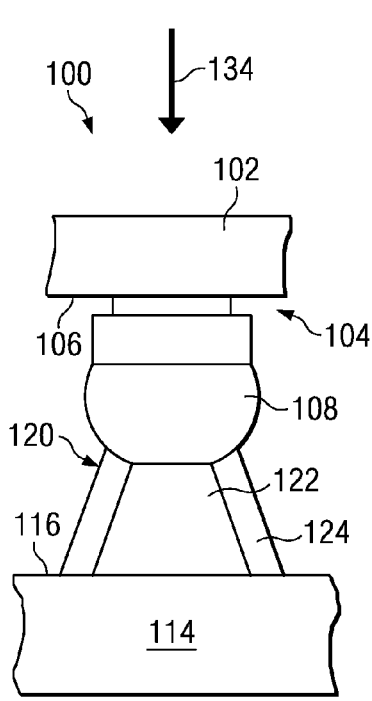
FIG. 10 is a schematic diagram showing the die and substrate of FIG. 7 after a second compression force is applied.

The fabrication process proceeds with the application of a second compression force applied between the die 102 and the substrate 114 as shown in FIG. 10 and as described in step 208 of the flow chart 200. The second compression force is applied in the direction 134 for a predetermined period and with a predetermined magnitude. The application of the second compression force causes the solder bump 108 to contact the conductor 122 as shown in FIG. 10. The second compression force also further disrupts the coating 124 for the possible application of a third compression force as described in greater detail below.

In some embodiments, the connection between the solder bump 108 and the conductor 122 is complete at this point. In these embodiments, the solder bump 108 and the conductor 122 have a wet connection without any traps between them. In such embodiments, other processes of the fabrication process of the device 100 may continue. In other embodiments, the cycling of the compression and retraction forces continues as described below.

Figure 11:
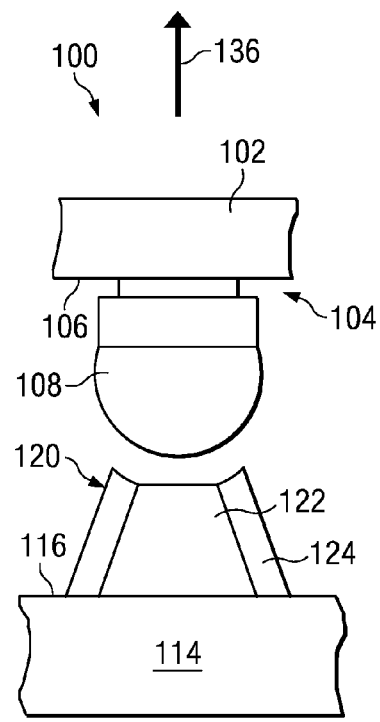
FIG. 11 is a schematic diagram showing the die and substrate of FIG. 7 after a second retracting force is applied.

The continuing application of the compression and retraction forces may continue as described above. In these embodiments, a second retraction force shown by FIG. 11 and described in step 210 of FIG. 6 is applied between the die 102 and the substrate 104 in the direction 136. The application of the second retraction force causes the solder bump 108 to retract from the conductor 122 but remain in the coating 124. In other embodiments, the solder bump 108 may remain in contact with the conductor 122. In some other embodiments, the second retraction force may cause the solder bump 108 to retract completely from the coating 124. As with the first retraction force, the second retraction force further disrupts the coating 124 so that the solder bump 108 may make better contact with the conductor 122 when the die 102 and the substrate 114 are forced together again as described below.

Figure 12:
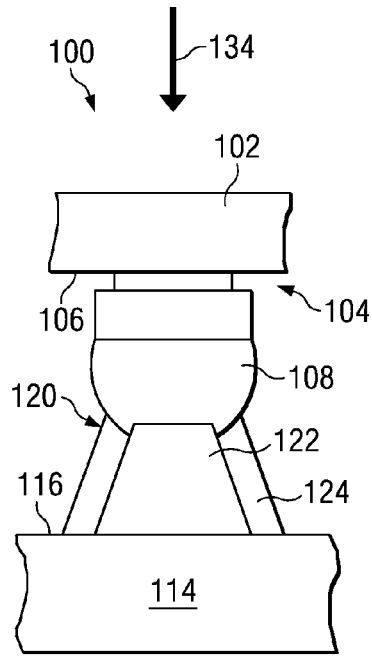
FIG. 12 is a schematic diagram showing the die and substrate of FIG. 7 after a third compression force is applied.

The bonding process is complete after a third compression force is applied between the die 102 and the substrate 114 in a direction 134 as shown in FIG. 12 and as described in step 212 of FIG. 6. The third compression force causes the solder bump 106 to contact or otherwise bond with the conductor 122 to form a bond that is wet enough to maintain a physical and an electrical connection. The bond as shown in FIG. 12 is also free of traps, which increases the strength and durability of the bond. At this point, conventional fabrication processes of the device 100 may continue.

Figure 13:
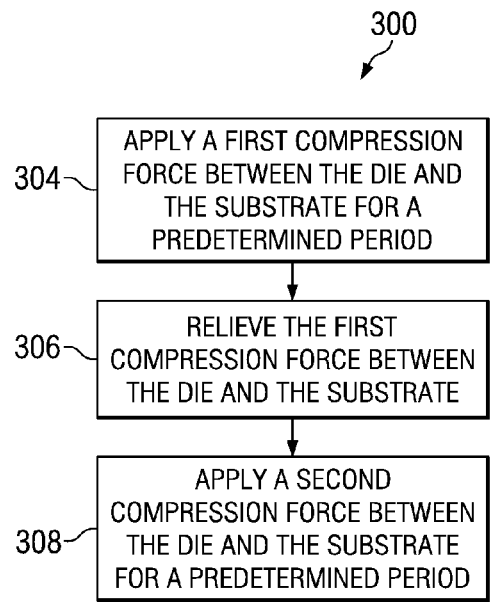
FIG. 13 is a flow chart illustrating an embodiment of a method of connecting a solder bump located on a die to a lead located on a substrate.

The fabrication process described above applies a compression force followed by a retraction force in the opposite direction. In some embodiments, the retraction force is not applied. Rather, the compression force is followed by equilibrium where no force is applied between the die 102 and the substrate 114. An embodiment of a method of connecting a solder bump located on a die to a lead located on a substrate is shown by the flowchart 300 of FIG. 13. A first compression force is applied between the die 102 and substrate 114 as shown in step 304. The first compression force is relieved during a period of equilibrium at step 306. Subsequent to the period of equilibrium, a second compression force is applied between the die 102 and the substrate 114 as described in step 308. It is noted that between the application of the compression force and the retraction force of the previously described embodiments, there may be a period where no force is applied or where the application of the compressive force is relieved.

Figure 14:
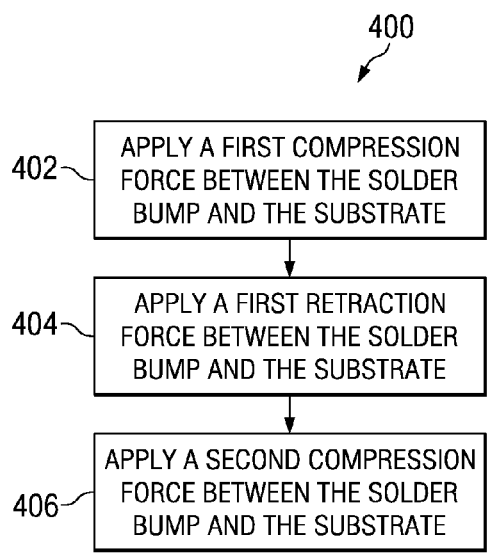
FIG. 14 is a flow chart illustrating another embodiment of a method of connecting a solder bump located on a die to a lead on a substrate.

An embodiment of a method of connecting a solder bump on a die to a lead on a substrate is described in the flow chart 400 of FIG. 14. At step 402, the first compression force is applied between the solder bump 108 and the lead 120. At step 404, the first retraction force is applied between the solder bump 108 and the lead 120. At step 406, the second compression force is applied between the solder bump 108 and the lead 120.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A method of connecting a solder bump located on a die to a lead located on a substrate, said method comprising:
    applying a first compression force between said solder bump and said lead;
    relieving said first compression force between said solder bump and said lead; and
    applying a second compression force between said solder bump and said lead,
    wherein said compression force is greater than said first compression force.

2. The method of claim 1, and further comprising applying a retraction force between said solder bump and said lead after relieving said first compression force, wherein said retraction force is applied in a direction opposite said first compression force.

3. The method of claim 1, wherein said applying said second compression force causes said solder bump to have a wet connection with said conductor.

4. The method of claim 1 and further comprising:
    relieving said second compression force between said solder bump and said lead; and
    applying a third compression force between said solder bump and said lead.

5. The method of claim 4, wherein said third compression force is greater than said second compression force.

6. The method of claim 4, and further comprising applying a retraction force between said solder bump and said lead after relieving said second compression force, wherein said retraction force is applied in a direction opposite said second compression force.

7. The method of claim 4, wherein said lead comprises a conductor covered by a coating, and wherein said applying said third compression force forces said solder bump into said coating.

8. The method of claim 4, wherein said lead comprises a conductor covered by a coating, and wherein said applying said third compression force forces said solder bump into said coating and in contact with said conductor.

9. The method of claim 1, wherein said lead comprises a conductor covered by a coating, and wherein said applying a first compression force forces said solder bump into said coating.

10. The method of claim 9, wherein said applying said second compression force causes said solder bump to contact said conductor.

11. The method of claim 1 and further comprising applying heat proximate said solder bump and said lead.

12. The method of claim 1, wherein applying said compression forces comprises forcing said die and said substrate together.

13. A method of connecting a solder bump on a die to a lead on a substrate, said method comprising:
    applying a first compression force between said solder bump and said lead;
    applying a first retraction force between said solder bump and said lead, said first retraction force being in the opposite direction from said first compression force;
    applying a second compression force between said solder bump and said lead, said second compression force being in the same direction as said first compression force,
    wherein said compression force is greater than said first compression force.

14. The method of claim 13, wherein said lead comprises a conductor covered by a coating, and wherein said applying a first compression force forces said solder bump into said coating.

15. The method of claim 14, wherein said applying said second compression force causes said solder bump to contact said conductor.

16. The method of claim 13 and further comprising:
    applying a second retraction force between said solder bump and said lead, said second retraction force being in the opposite direction from said second compression force; and
    applying a third compression force between said solder bump and said lead.

17. The method of claim 16, wherein said third compression force is greater than said second compression force.

18. The method of claim 16, wherein said applying said third compression force causes a wet connection between said solder bump and said lead.

19. The method of claim 13, wherein applying the compression forces comprises forcing said die and said substrate together.

* * * * *